US008217404B2

United States Patent
Wu et al.

(10) Patent No.: US 8,217,404 B2
(45) Date of Patent: *Jul. 10, 2012

(54) LIGHT-MIXING TYPE LED PACKAGE STRUCTURE FOR INCREASING COLOR RENDER INDEX

(75) Inventors: Chao-Chin Wu, Taipei (TW); Chia-Tin Chung, Toufen Township, Miaoli County (TW)

(73) Assignee: Paragon Semiconductor Lighting Technology Co., Ltd., Gueishan, Township (TW)

( * ) Notice: Subject to any disclaimer, the term of this patent is extended or adjusted under 35 U.S.C. 154(b) by 196 days.

This patent is subject to a terminal disclaimer.

(21) Appl. No.: 12/756,317

(22) Filed: Apr. 8, 2010

(65) Prior Publication Data

US 2011/0193108 A1     Aug. 11, 2011

(30) Foreign Application Priority Data

Feb. 8, 2010    (TW) .............................. 99103780 A

(51) Int. Cl.
*H01L 29/18*     (2006.01)
*H01L 33/00*     (2010.01)
(52) U.S. Cl. ............... 257/88; 257/21; 257/82; 257/84; 257/99; 257/100; 257/431; 257/433; 257/788; 257/E33.001; 257/E31.099; 257/E31.105

(58) Field of Classification Search .................... 257/21, 257/82, 84, 88, 99, 100, 431, 433, 788, E33.001, 257/E31.099, E31.105; 313/506, 509, 512
See application file for complete search history.

(56) References Cited

U.S. PATENT DOCUMENTS

| 6,340,824 | B1* | 1/2002 | Komoto et al. | 257/99 |
| 7,683,470 | B2* | 3/2010 | Lee et al. | 257/687 |
| 2007/0176198 | A1* | 8/2007 | Lee et al. | 257/99 |
| 2009/0057687 | A1* | 3/2009 | Wang et al. | 257/82 |

* cited by examiner

*Primary Examiner* — Michelle Mandala
(74) *Attorney, Agent, or Firm* — C. G. Mersereau; Nikolai & Mersereau, P.A.

(57) ABSTRACT

A light-mixing type LED package structure for increasing color render index includes a substrate unit, a light-emitting unit, a frame unit and a package unit. The light-emitting unit has a first light-emitting module for generating a first color temperature and a second light-emitting module for generating a second color temperature. The frame unit has two annular resin frames surroundingly formed on the top surface of the substrate unit by coating. The two annular resin frames respectively surround the first light-emitting module and the second light-emitting module in order to form two resin position limiting spaces above the substrate unit. The package unit has a first translucent package resin body and a second translucent package resin body both disposed on the substrate unit and respective covering the first light-emitting module and the second light-emitting module.

10 Claims, 7 Drawing Sheets

LIGHT-MIXING TYPE LED PACKAGE STRUCTURE FOR INCREASING COLOR RENDER INDEX

BACKGROUND OF THE INVENTION

1. Field of the Invention

The present invention relates to a light-mixing type LED package structure, and more particularly, to a light-mixing type LED package structure for increasing color render index.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage. Hence, LED lamp or LED tube is created in order to solve the above-mentioned questions of the prior lamp.

SUMMARY OF THE INVENTION

In view of the aforementioned issues, the present invention provides a light-mixing type LED package structure for increasing color render index. The present invention provides an LED module with high color temperature and an LED module with low color temperature connected each other in parallel in order to create the light-mixing type LED package structure with high color render index.

Moreover, the present invention can form an annular resin frame (such as an annular white resin frame) with any shapes by coating method. In addition, the position of a translucent package resin body such as phosphor resin can be limited in the resin position limiting space by using the annular resin frame, and the shape of the translucent package resin body can be adjusted by using the annular resin frame. Therefore, the present invention can apply to increase light-emitting efficiency of LED chips and control light-projecting angle of LED chips.

To achieve the above-mentioned objectives, the present invention provides a light-mixing type LED package structure for increasing color render index, including: a substrate unit, a light-emitting unit, a frame unit and a package unit. The substrate unit has at least one substrate body and at least two chip-placing areas formed on the at least one substrate body. The light-emitting unit has at least one first light-emitting module for generating a first color temperature and at least one second light-emitting module for generating a second color temperature. The at least one first light-emitting module has a plurality of first light-emitting chips electrically disposed on one of the chip-placing areas of the substrate unit, and the at least one second light-emitting module has a plurality of second light-emitting chips electrically disposed on the other chip-placing area of the substrate unit. The frame unit has at least two annular resin frames surroundingly formed on a top surface of the substrate body by coating. The at least two annular resin frames respectively surround the at least one first light-emitting module and the at least one second light-emitting module in order to form at least two resin position limiting spaces above the substrate body. The package unit has at least one first translucent package resin body and at least one second translucent package resin body both disposed on the substrate body and respectively covering the at least one first light-emitting module and the at least one second light-emitting module. The at least one first translucent package resin body and the at least one second translucent package resin body are limited in the at least two resin position limiting spaces.

Hence, one light-emitting module with high color temperature and another light-emitting module with low color temperature both are connected each other in parallel to form two light-emitting bars abutted against each other in order to create the light-mixing type LED package structure with high color render index.

Furthermore, the translucent package resin body is limited in the resin position limiting space by using the annular resin frame in order to control the usage quantity of the translucent package resin body. In addition, the surface shape and the height of the translucent package resin body can be adjusted by control the usage quantity of the translucent package resin body in order to adjust light-projecting angles of the white light beams. Moreover, the blue light beams generated by the LED chips can be reflected by an inner wall of the annular resin frame in order to increase the light-emitting efficiency of the LED package structure of the present invention.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1A:
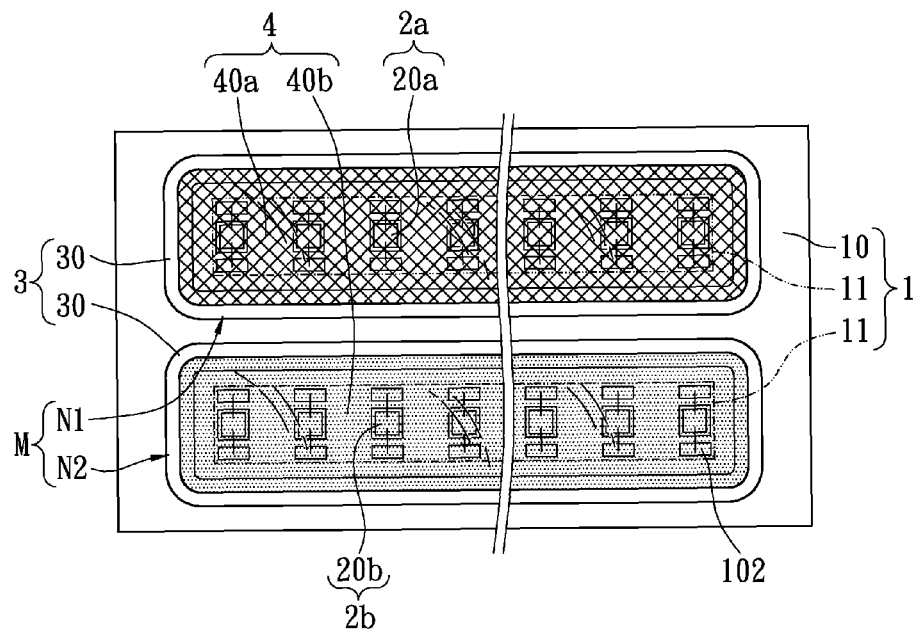
FIG. 1A is a top, schematic view of the light-mixing type LED package structure according to the first embodiment of the present invention.
Figure 1B:
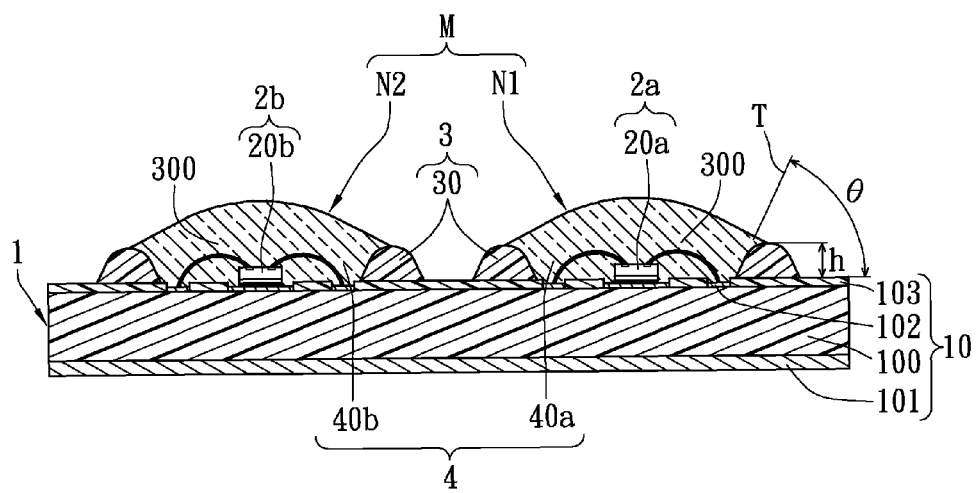
FIG. 1B is a lateral, cross-sectional, schematic view of the light-mixing type LED package structure according to the first embodiment of the present invention.

Referring to FIGS. 1A and 1B, the first embodiment of the present invention provides a light-mixing type LED package structure M for increasing color render index, including: a substrate unit 1, a light-emitting unit, a frame unit 3 and a package unit 4.

The substrate unit 1 has at least one substrate body 10 and at least two chip-placing areas 11 formed on the at least one substrate body 10. In addition, the substrate body 10 has a circuit substrate 100, a heat-dissipating layer 101 disposed on a bottom surface of the circuit substrate 100, a plurality conductive pads 102 disposed on a top surface of the circuit substrate 100, and an insulative layer 103 disposed on the top surface of the circuit substrate 100 in order to expose the conductive pads 102. Hence, the heat-dissipating efficiency of the circuit substrate 100 is increased by using the heat-dissipating layer 101, and the insulative layer 103 is a solder mask for exposing the conductive pads 102 only in order to achieve local soldering. However, the above-mentioned definition of the substrate body 10 does not limit the present invention. Any types of substrate can be applied to the present invention. For example, the substrate body 10 can be a PCB (Printed Circuit Board), a flexible substrate, an aluminum substrate, a ceramic substrate, or a copper substrate.

Moreover, the light-emitting unit has at least one first light-emitting module 2a for generating a first color temperature and at least one second light-emitting module 2b for generating a second color temperature. The first light-emitting module 2a has a plurality of first light-emitting chips (such as LED chips) 20a electrically disposed on one of the chip-placing areas 11 of the substrate unit 1, and the second light-emitting module 2b has a plurality of second light-emitting chips (such as LED chips) 20b electrically disposed on the other chip-placing area 11 of the substrate unit 1. In other words, In other words, designer can plan at least two predetermined chip-placing areas 11 on the substrate unit 1 in advance, so that the first light-emitting chips 20a and the second light-emitting chips 20b can be respectively placed on the two chip-placing areas 11 of the substrate unit 1. In the first embodiment, the first light-emitting chips 20a and the second light-emitting chips 20b are respectively electrically disposed on the two chip-placing areas 11 of the substrate unit 1 by wire bonding.

Furthermore, the frame unit 3 has at least two annular resin frames 30 surroundingly formed on a top surface of the substrate body 10 by coating. The two annular resin frames 30 respectively surround the first light-emitting module 2a and the second light-emitting module 2b in order to form at least two resin position limiting spaces 300 above the substrate body 10. In addition, the two annular resin frames 30 are selectively separated from each other or connected with each other, and the two annular resin frames 30 are disposed on the substrate body 10 in parallel, according to different requirements. In the first embodiment, the two annular resin frames 30 are separated from each other by a predetermined distance, and the two annular resin frames 30 are disposed on the substrate body 10 in parallel.

Each annular resin frame 30 has an arc shape formed on a top surface thereof. Each annular resin frame 30 has a radius tangent T and the angle θ of the radius tangent T relative to the top surface of the substrate body 10 is between 40° C. and 50° C. The maximum height of each annular resin frame 30 relative to the top surface of the substrate body 10 is between 0.3 mm and 0.7 mm. The width of a bottom side of each annular resin frame 30 is between 1.5 mm and 3 mm. The thixotropic index of each annular resin frame 30 is between 4 and 6, and each annular resin frame 30 is a white thermohardening resin frame (opaque resin frame) mixed with inorganic additive.

The method for forming each annular resin frame 30 includes: first, surroundingly coating liquid resin (not shown) on the top surface of the substrate body 10. In addition, the liquid resin can be coated on the substrate body 10 by any shapes according to different requirements (such as a circular shape, a square or a rectangular shape etc.). The thixotropic index of the liquid resin is between 4 and 6, the pressure of coating the liquid resin on the top surface of the substrate body 10 is between 350 kpa and 450 kpa, and the velocity of coating the liquid resin on the top surface of the substrate body 10 is between 5 mm/s and 15 mm/s. The liquid resin is surroundingly coated on the top surface of the substrate body 10 from a start point to a termination point, and the position of the start point and the position of the termination point are the same. Furthermore, the method further includes: hardening the liquid resin to form an annular resin frame 30, and the annular resin frame 30 surrounding the light-emitting chips (20a or 20b) that are disposed on the chip-placing area 11 to form a resin position limiting space 300 above the substrate body 10. In addition, the liquid resin is hardened by baking, the baking temperature is between 120° C. and 140° C., and the baking time is between 20 minutes and 40 minutes.

Moreover, the package unit 4 has at least one first translucent package resin body 40a and at least one second translucent package resin body 40b both disposed on the substrate body 10 and respectively covering the first light-emitting module 2a and the second light-emitting module 2b. The first translucent package resin body 40a and the second translucent package resin body 40b are limited in the two resin position limiting spaces 300. In addition, the top surface of the first translucent package resin body 40a and the top surface of the second translucent package resin body 40b are convex surfaces.

In the first embodiment, the light wavelengths of each first light-emitting chips 20a and each second light-emitting chip 20b can be between 400 nm and 500 nm.

In addition, each first light-emitting chip 20a is a blue light-emitting chip, the first translucent package resin body 40a is a phosphors with a first color, and light beams generated by the blue light-emitting chips pass through the first translucent package resin body 40a for generating yellow beams about 3500±500 color temperature. Moreover, one part of the above-mentioned elements is combined to form a first light-emitting structure N1 that is composed of the substrate body 10, the first light-emitting chips 20a, the annular resin frame 30 and the first translucent package resin body 40a.

In addition, each second light-emitting chip 20b is a blue light-emitting chip, the second translucent package resin body 40b is a phosphors with a second color, and light beams generated by the blue light-emitting chips pass through the second translucent package resin body 40b for generating white beams about 6500±500 color temperature. Moreover, one part of the above-mentioned elements is combined to form a second light-emitting structure N2 that is composed of the substrate body 10, the second light-emitting chips 20a, the annular resin frame 30 and the second translucent package resin body 40b.

Hence, the first light-emitting structure N1 can generate yellow light and the second light-emitting structure N2 can generate white light, and the yellow light and the white light can be mixed to increase color render index. In addition, the first light-emitting structure N1 and the second light-emitting structure N2 can respectively generate "red light and white light" or "red light and green light".

Furthermore, the first light-emitting structure N1 and the second light-emitting structure N2 can share the substrate unit 1 as shown in the first embodiment or use different substrate units. The first light-emitting structure N1 and the second light-emitting structure N2 are combined to form the light-mixing type LED package structure M of the present invention.

Figure 2A:
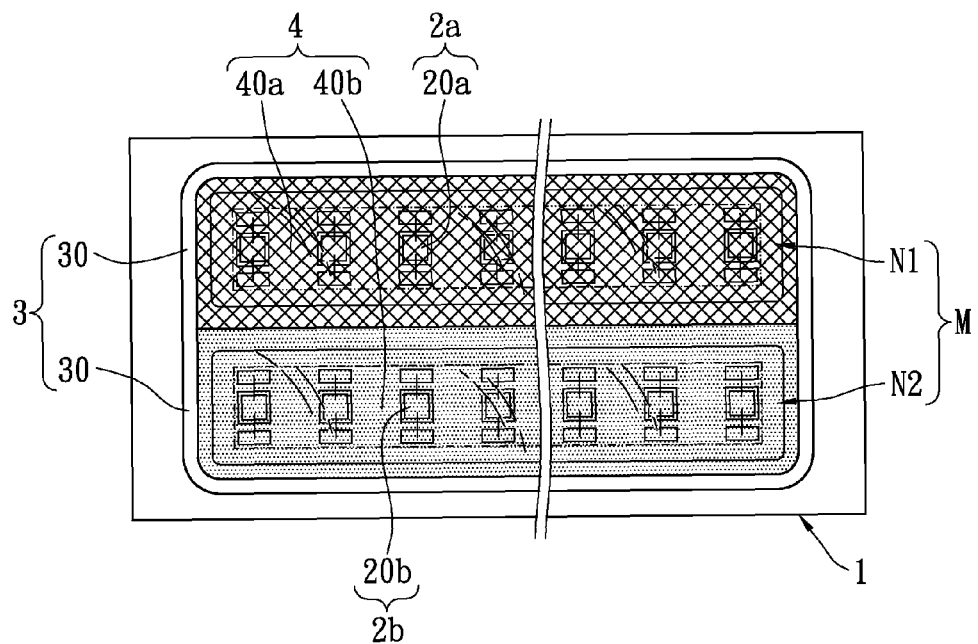
FIG. 2A is a top, schematic view of the light-mixing type LED package structure according to the second embodiment of the present invention.
Figure 2B:
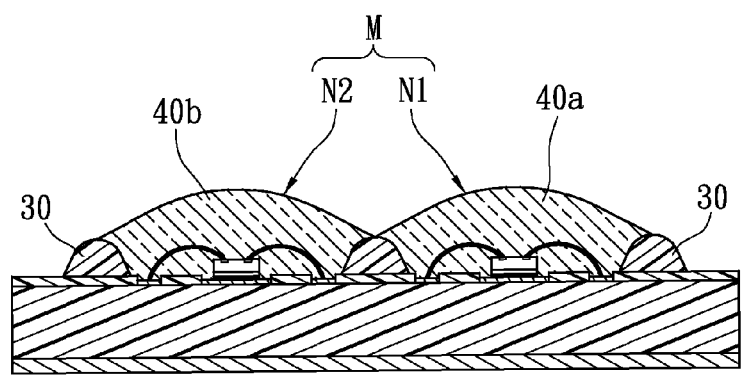
FIG. 2B is a lateral, cross-sectional, schematic view of the light-mixing type LED package structure according to the second embodiment of the present invention.

Referring to FIGS. 2A and 2B, the second embodiment of the present invention provides a light-mixing type LED package structure M for increasing color render index, including: a substrate unit 1, a light-emitting unit, a frame unit 3 and a package unit 4. The light-emitting unit has at least one first light-emitting module 2a for generating a first color temperature and at least one second light-emitting module 2b for generating a second color temperature. The difference between the second embodiment and the first embodiment is that: in the second embodiment, the two annular resin frames 30 are connected with each other in parallel.

Figure 3A:
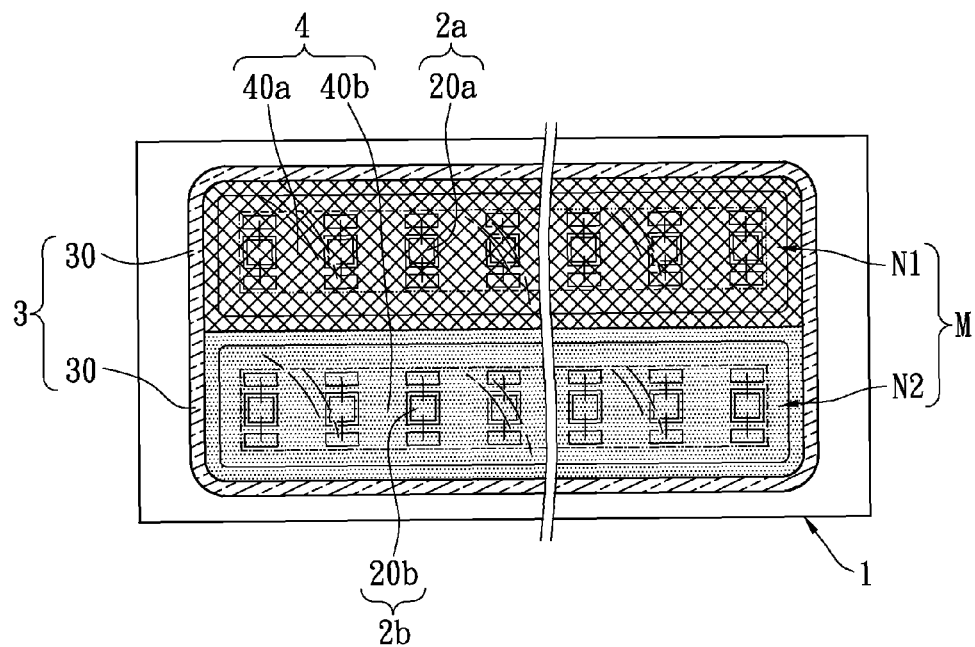
FIG. 3A is a top, schematic view of the light-mixing type LED package structure according to the third embodiment of the present invention.
Figure 3B:
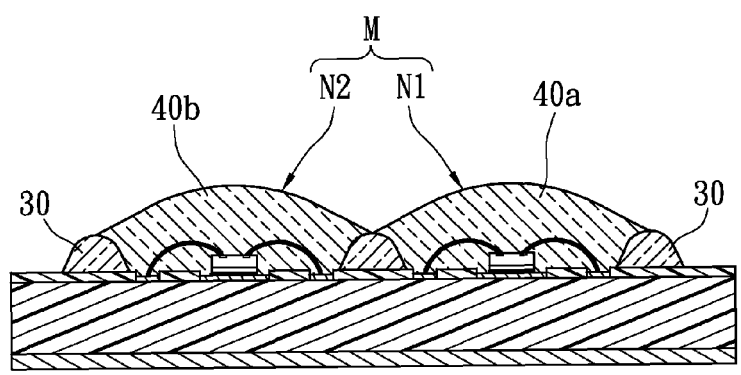
FIG. 3B is a lateral, cross-sectional, schematic view of the light-mixing type LED package structure according to the third embodiment of the present invention.

Referring to FIGS. 3A and 3B, each annular resin frame 30 can be a phosphor resin. In other words, phosphor powders can be selectively add to each annular resin frame 30 according to different requirements in order to decrease dark bands that are generated between the first translucent package resin body 40a and the second translucent package resin body 40b.

Figure 4A:
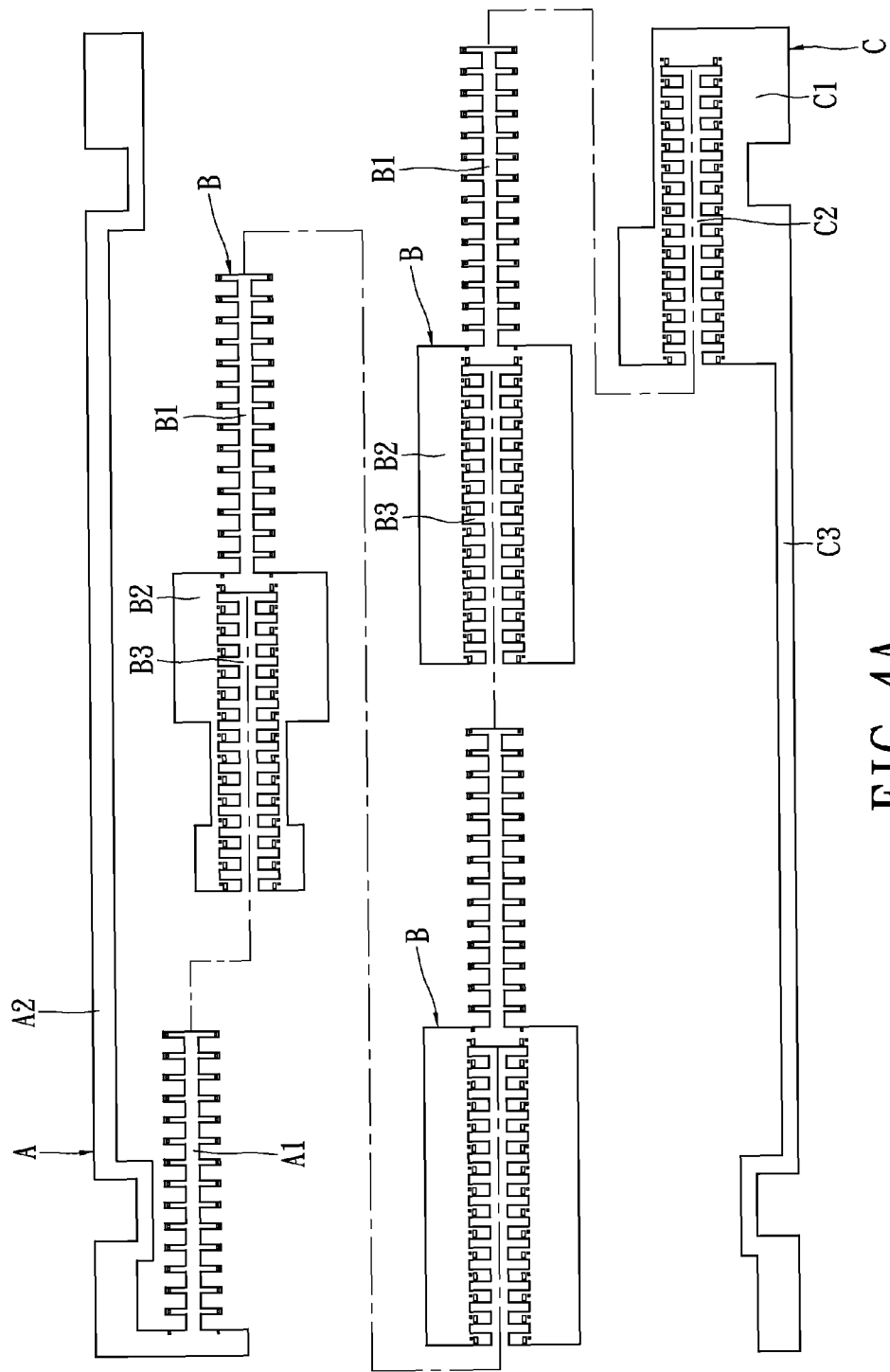
FIG. 4A is an exploded, schematic view of the conductive unit of the substrate body according to the present invention.
Figure 4B:
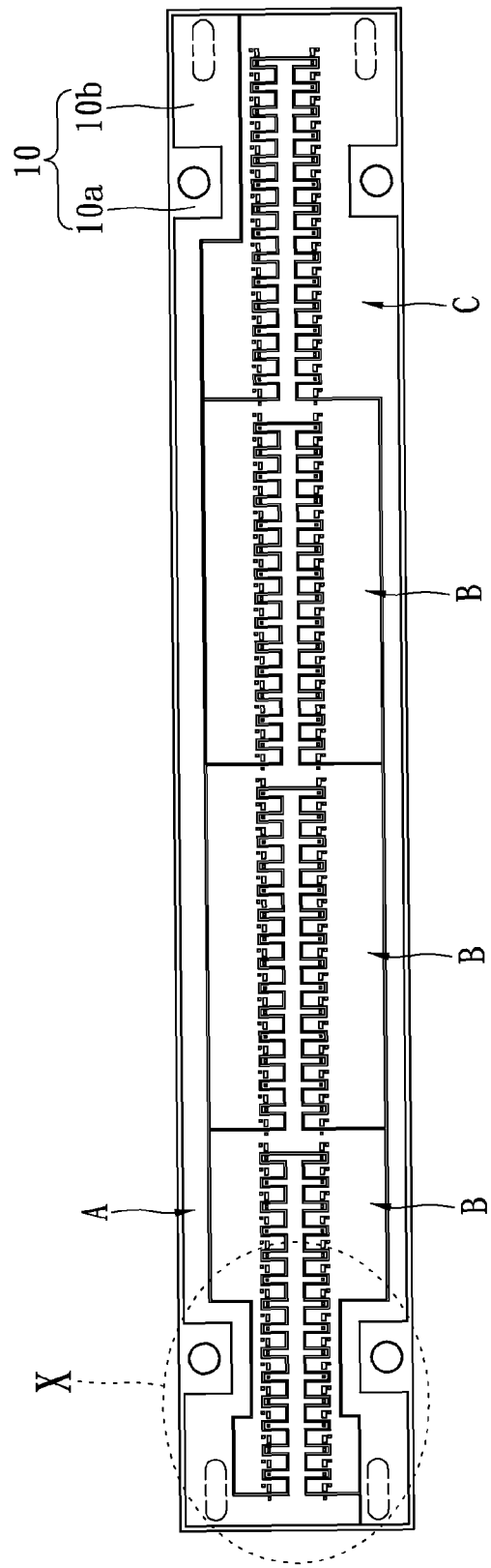
FIG. 4B is an assembled, schematic view of the conductive unit of the substrate body according to the present invention.
Figure 4C:
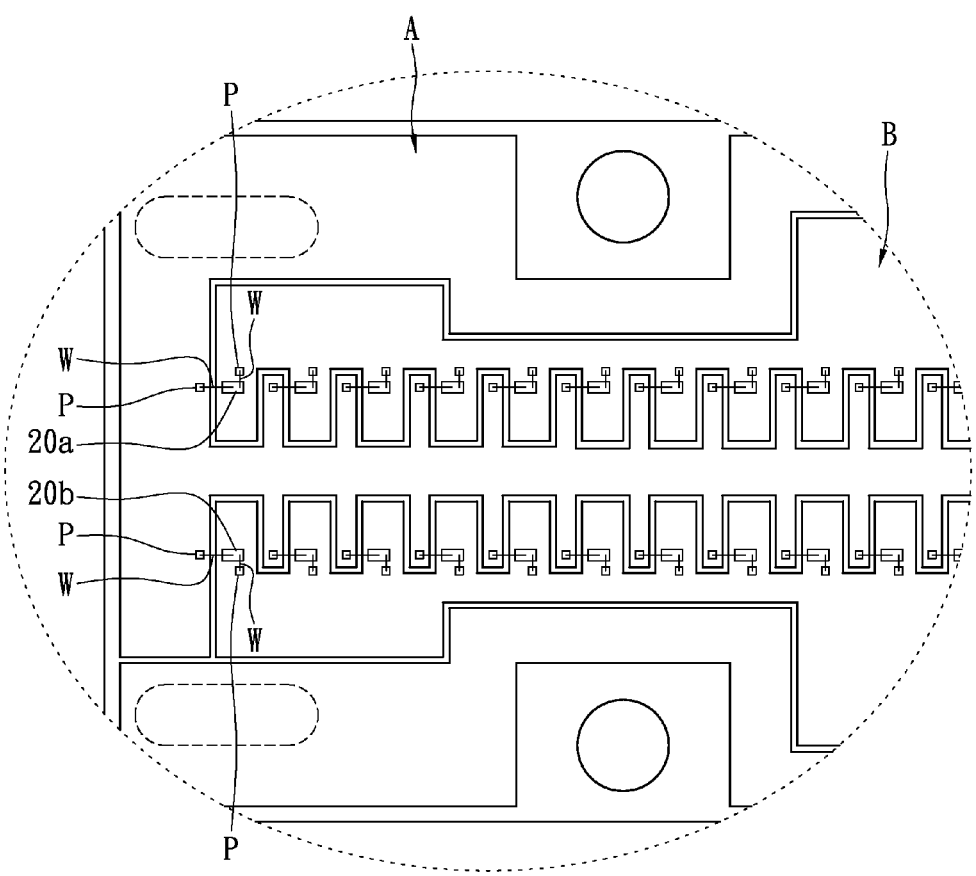
FIG. 4C is an enlarged view of the X part showing a first type of wire bonding method in FIG. 4B.

Referring to FIGS. 4A to 4C, the substrate body 10 has a substrate 10a and a conductive unit 10b disposed on the substrate 10a. The conductive unit 10b has at least one first conductive element A, a plurality of second conductive elements B and at least one third conductive element C. The first conductive element A, the second conductive elements B and the third conductive element C are separated from each other. In other words, the first conductive element A, the second conductive elements B and the third conductive element C are separated from each other are mated with each other, but they do not contact to each other. In addition, the conductive pads P, the first light-emitting chips 20a and the second light-emitting chips 20b are selectively disposed on the conductive unit 10b. The first conductive element A, the second conductive elements B and the third conductive element C do not contact to each other, so that the first light-emitting chips 20a and the second light-emitting chips 20b may be selectively lighted up to show a light-emitting area of different size according to different requirements.

Moreover, the at least one first conductive element A has a first fishbone extending portion A1. Each second conductive element B has a second fishbone extending portion B1, a first connection portion B2 extended outwards from one end of the second fishbone extending portion B1 and a first fishbone opening B3 passing through the first connection portion B2. The at least one third conductive element C has a second connection portion C1 and a second fishbone opening C2 passing through the second connection portion C1. The first fishbone extending portion A1 is received in the first fishbone opening B3 of first one of the second conductive elements B, the second fishbone extending portion B1 of last one of the second conductive elements B is received in the second fishbone opening C2 of the at least one third conductive element C, and each second fishbone extending portion B1 of the other second conductive elements B is received in each first fishbone opening B3 of the adjacent second conductive element B.

In addition, the first conductive element A has a first outer extending portion A2 substantially parallel and extended towards the third conductive element C. The third conductive element C has a second outer extending portion C3 substantially parallel to the first outer extending portion A2 and extended towards the first conductive element A.

Referring to FIG. 4C, each first light-emitting chip 20a has a positive electrode and a negative electrode respectively disposed on the top surface of each first light-emitting chip 20a, so that the positive electrode and the negative electrode of each first light-emitting chip 20a are electrically connected between two conductive pads P by two conductive wires W. Each second light-emitting chip 20b has a positive electrode and a negative electrode respectively disposed on the top surface of each second light-emitting chip 20b, so that the positive electrode and the negative electrode of each second light-emitting chip 20b are electrically connected between two conductive pads P by two conductive wires W.

Figure 4D:
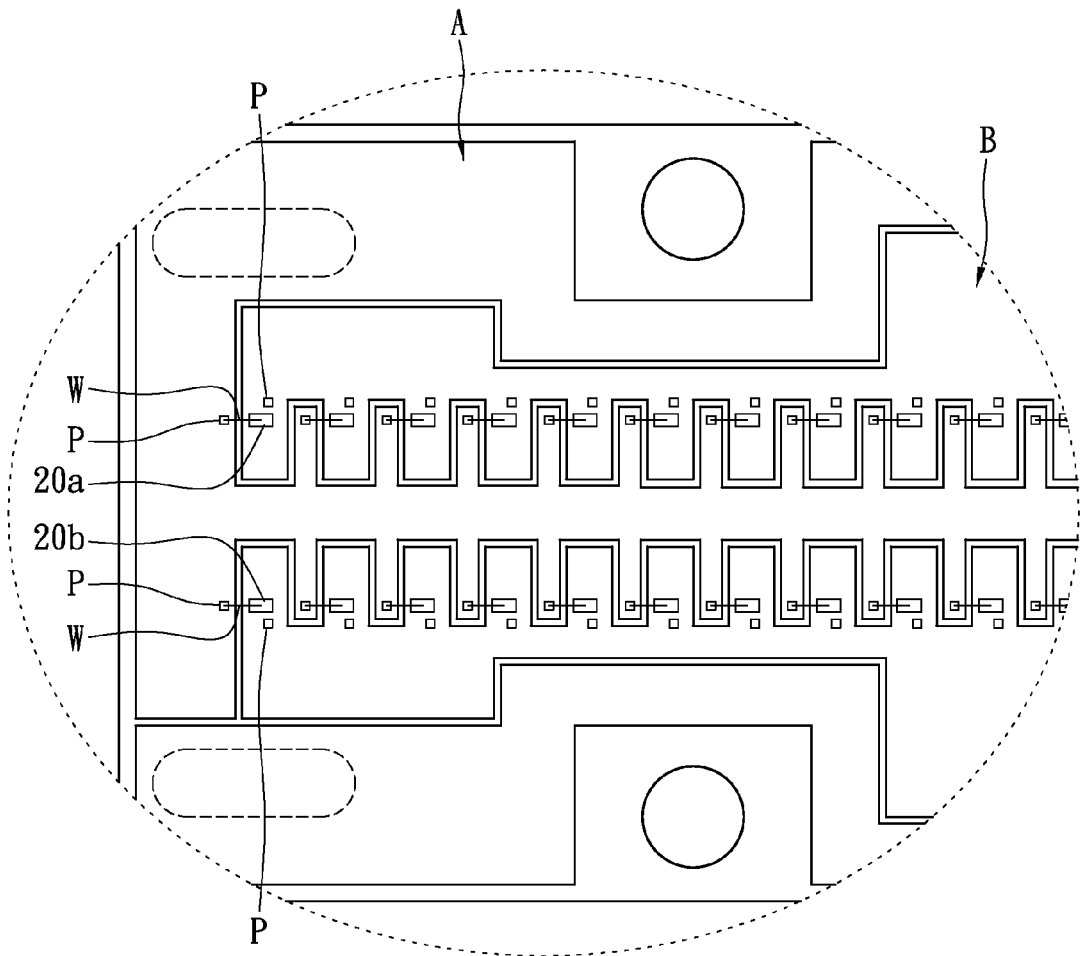
FIG. 4D is an enlarged view of the X part showing a second type of wire bonding method in FIG. 4B.
Figure 4E:
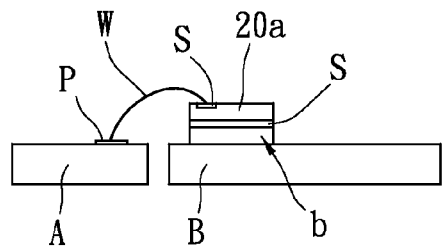
FIG. 4E is a lateral, schematic view of the second type of wire bonding method according to the present invention.

Referring to FIGS. 4D and 4E, each first light-emitting chip 20a has two electrodes S respectively disposed on the top surface and the bottom surface of each first light-emitting chip 20a, so that one electrode S on the top surface is electrically connected to one conductive pad P by a conductive wire W and another electrode S on the bottom surface is electrically connected to another conductive pad P by a conductive body b such as solder ball. The method of electrically connecting each second light-emitting chip 20b with the conductive unit 10b is the same as the method of electrically connecting the each first light-emitting chip 20a with the conductive unit 10b.

In conclusion, one light-emitting module with high color temperature and another light-emitting module with low color temperature both are connected each other in parallel in order to create the light-mixing type LED package structure with high color render index.

Furthermore, the present invention can form an annular resin frame (such as an annular white resin frame) with any shapes by coating method. In addition, the position of a translucent package resin body such as phosphor resin can be limited in the resin position limiting space by using the annular resin frame, and the shape of the translucent package resin body can be adjusted by using the annular resin frame. Therefore, the present invention can apply to increase light-emitting efficiency of LED chips and control light-projecting angle of LED chips. In other words, the translucent package resin body is limited in the resin position limiting space by using the annular resin frame in order to control the usage quantity of the translucent package resin body. In addition, the surface shape and the height of the translucent package resin body can be adjusted by control the usage quantity of the translucent package resin body in order to adjust light-projecting angles of the white light beams. Moreover, the blue light beams generated by the LED chips can be reflected by an inner wall of the annular resin frame in order to increase the light-emitting efficiency of the LED package structure of the present invention.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. A light-mixing type LED package structure for increasing color render index, comprising:
   a substrate unit having at least one substrate body and at least two chip-placing areas formed on the at least one substrate body;
   a light-emitting unit having at least one first light-emitting module for generating a first color temperature and at least one second light-emitting module for generating a second color temperature, wherein the at least one first light-emitting module has a plurality of first light-emitting chips electrically disposed on one of the chip-placing areas of the substrate unit, the at least one second light-emitting module has a plurality of second light-emitting chips electrically disposed on the other chip-placing area of the substrate unit, and each first light-emitting chip and each second light-emitting chip are blue light-emitting chips;
   a frame unit having at least two annular resin frames surroundingly formed on a top surface of the substrate body by coating, wherein the at least two annular resin frames respectively surround the at least one first light-emitting module and the at least one second light-emitting module in order to form at least two resin position limiting spaces above the substrate body; and
   a package unit having at least one first translucent package resin body and at least one second translucent package resin body both disposed on the substrate body and respectively covering the at least one first light-emitting module and the at least one second light-emitting module, wherein the at least one first translucent package resin body and the at least one second translucent package resin body are limited in the at least two resin position limiting spaces.

2. The light-mixing type LED package structure according to claim 1, wherein the substrate body has a circuit substrate, a heat-dissipating layer disposed on a bottom surface of the circuit substrate, a plurality conductive pads disposed on a top surface of the circuit substrate, and an insulative layer disposed on the top surface of the circuit substrate in order to expose the conductive pads.

3. The light-mixing type LED package structure according to claim 1, wherein the at least one first translucent package resin body is a phosphors with a first color, and light beams generated by the blue light-emitting chips pass through the at least one first translucent package resin body for generating yellow beams about 3500±500 K color temperature, wherein the at least one second translucent package resin body is a phosphors with a second color, and light beams generated by the blue light-emitting chips pass through the at least one second translucent package resin body for generating white beams about 6500±500 K color temperature.

4. The light-mixing type LED package structure according to claim 1, wherein the light wavelengths of each first light-emitting chips and each second light-emitting chip are between 400 nm and 500 nm.

5. The light-mixing type LED package structure according to claim 1, wherein the first color temperature generated by the at least one first light-emitting module is smaller than the second color temperature generated by the at least one second light-emitting module.

6. The light-mixing type LED package structure according to claim 1, wherein the at least two annular resin frames are phosphor resins.

7. The light-mixing type LED package structure according to claim 1, wherein the at least two annular resin frames are selectively separated from each other or connected with each other, and the at least two annular resin frames are disposed on the substrate body in parallel.

8. The light-mixing type LED package structure according to claim 1, wherein each annular resin frame has an arc shape formed on a top surface thereof, each annular resin frame has a radius tangent and the angle of the radius tangent relative to the top surface of the substrate body is between 40° and 50°, the maximum height of each annular resin frame relative to the top surface of the substrate body is between 0.3 mm and 0.7 mm, the width of a bottom side of each annular resin frame is between 1.5 mm and 3 mm, the thixotropic index of each annular resin frame is between 4 and 6, and each annular resin frame is a white thermohardening resin frame mixed with inorganic additive.

9. The light-mixing type LED package structure according to claim 1, wherein the substrate body has a substrate and a conductive unit disposed on the substrate, the conductive unit has at least one first conductive element, a plurality of second conductive elements and at least one third conductive element, the at least one first conductive element, the second conductive elements and the at least one third conductive element are separated from each other, and the first light-emitting chips and the second light-emitting chips are selectively disposed on the conductive unit.

10. The light-mixing type LED package structure according to claim 9, wherein the at least one first conductive element has a first fishbone extending portion, each second conductive element has a second fishbone extending portion, a first connection portion extended outwards from one end of the second fishbone extending portion and a first fishbone opening passing through the first connection portion, the at least one third conductive element has a second connection portion and a second fishbone opening passing through the second connection portion, the first fishbone extending portion is received in the first fishbone opening of first one of the second conductive elements, the second fishbone extending portion of last one of the second conductive elements is received in the second fishbone opening of the at least one third conductive element, and each second fishbone extending portion of the other second conductive elements is received in each first fishbone opening of the adjacent second conductive element.

* * * * *